United States Patent
Piquette

(10) Patent No.: US 10,297,704 B2
(45) Date of Patent: May 21, 2019

(54) LOW NOISE DETECTORS FOR ASTRONOMY

(71) Applicant: Teledyne Scientific & Imaging, LLC, Thousand Oaks, CA (US)

(72) Inventor: Eric Piquette, Camarillo, CA (US)

(73) Assignee: TELEDYNE SCIENTIFIC & IMAGING, LLC, Thousand Oaks, CA (US)

(*) Notice: Subject to any disclaimer, the term of this patent is extended or adjusted under 35 U.S.C. 154(b) by 54 days.

(21) Appl. No.: 15/269,459

(22) Filed: Sep. 19, 2016

(65) Prior Publication Data

US 2017/0271530 A1 Sep. 21, 2017

Related U.S. Application Data

(60) Provisional application No. 62/308,776, filed on Mar. 15, 2016.

(51) Int. Cl.
*H01L 31/00* (2006.01)
*H01L 21/00* (2006.01)
(Continued)

(52) U.S. Cl.
CPC .... *H01L 31/1032* (2013.01); *H01L 31/02005* (2013.01); *H01L 31/022408* (2013.01); *H01L 31/1013* (2013.01); *H01L 31/1828* (2013.01)

(58) Field of Classification Search
CPC ......... H01L 31/02165; H01L 31/02005; H01L 31/09; H01L 31/18; H01L 31/1013; G01J 1/44; G01J 2001/444; G01J 2001/4233
See application file for complete search history.

(56) References Cited

U.S. PATENT DOCUMENTS 5,216,237 A * 6/1993 Ritchie ............. H01L 31/02165
250/214.1
6,043,550 A * 3/2000 Kuhara ............. H01L 31/02162
257/233

(Continued)

OTHER PUBLICATIONS

Wikipedia: Semiconductor device fabrication; https://en.wikipedia.org/wiki/Seimconductor_device_fabrication; printed Sep. 8, 2016; (6 pages).

(Continued)

*Primary Examiner* — Alonzo Chambliss
(74) *Attorney, Agent, or Firm* — Snell & Wilmer LLP

(57) ABSTRACT

Methods, systems, and apparatus that filters noise within a signal collected by a detector assembly. The detector assembly includes a first semiconductor layer of a first type configured to receive a photon. The detector assembly includes a second semiconductor layer of a second type. The second semiconductor layer is formed above the first semiconductor layer. The first semiconductor layer and the second semiconductor layer are configured to collect a signal. The detector assembly includes an interface layer including an insulator portion for filtering noise. The interface layer is formed on the second semiconductor layer. The detector assembly includes a metal contact layer formed on the interface layer. The interface layer is configured to capacitively couple the first semiconductor layer and second semiconductor layer with the metal contact layer.

20 Claims, 11 Drawing Sheets

(51) Int. Cl.
*H01L 31/103* (2006.01)
*H01L 31/02* (2006.01)
*H01L 31/0224* (2006.01)
*H01L 31/101* (2006.01)
*H01L 31/18* (2006.01)

(56) References Cited

U.S. PATENT DOCUMENTS

| | | | | |
|---|---|---|---|---|
| 6,521,968 B2* | 2/2003 | Kuhara | ............... | G02B 6/4246 257/461 |
| 6,696,740 B2* | 2/2004 | Kuhara | ............... | G02B 6/4246 257/460 |
| 2009/0008738 A1* | 1/2009 | Yuan | ............... | B82Y 20/00 257/438 |
| 2010/0295095 A1* | 11/2010 | Klipstein | ............... | H01L 31/101 257/184 |
| 2012/0080607 A1* | 4/2012 | Karim | ............... | H01L 31/115 250/370.13 |
| 2014/0001363 A1* | 1/2014 | Koyama | ............... | H01L 29/872 250/338.4 |
| 2014/0347538 A1* | 11/2014 | Toda | ............... | H01L 27/14603 348/308 |
| 2015/0372097 A1* | 12/2015 | Bao | ............... | H01L 29/0607 257/201 |

OTHER PUBLICATIONS

Wikipedia: Wide-bandgap semiconductor; https://en.wikipedia.org/wiki/Wide-bandgap_semiconductor; printed Sep. 8, 2016; (7 pages).

Intersil: How Semiconductors are Made; http://rel.intersil.com/docs/lexicon/manufacture.html; printed Sep. 8, 2016; (2 pages).

Silicon heterojunction solar cells with electron selective TiOx contact; https://www.researchgate.net/publication/295259350_Silicon_heterojunction_solar_cells_with_electron_selective_TiOx_contact; printed Sep. 16, 2016; (10 pages).

Amorphous silicon enhanced metal-insulator-semiconductor contacts for silicon solar cells; https://www.researchgate.net/publication/270274606_Amorphous_silicon_enhanced_metal-insulator-semiconductor_contacts_for_silicon_solar_cells; Printed Sep. 16, 2016; (31 pages).

The MINP solar cell—A new high voltage, high efficiency silicon solar cell; https://www.researchgate.net/publication/234505173_The_MINP_solar_cell_-_A_new_high_voltage_high_efficiency_silicon_solar_cell; Printed Sep. 16, 2016; (3 pages).

* cited by examiner

LOW NOISE DETECTORS FOR ASTRONOMY

CROSS-REFERENCE TO RELATED APPLICATIONS

This application claims priority to and the benefit of U.S. Provisional Patent Application No. 62/308,776, entitled "LOW NOISE DETECTORS FOR ASTRONOMY" and filed on Mar. 15, 2016, the entirety of which is hereby incorporated by reference herein.

BACKGROUND

1. Field

This specification relates to a system for reducing or eliminating noise within a detector assembly.

2. Description of the Related Art

Mercury-Cadmium-Telluride Focal Plane Arrays (MCT FPAs) are used for space applications. FPAs are used to capture light or photons from terrestrial bodies to produce digital images. The FPAs detect light or photons and collect the photocharge into pixels using electric fields created by a p-n junction in each pixel. The p-n junction is connected to a read-out integrated circuit (ROIC) which outputs an analog or digital signal. If the signal is an analog signal, the analog signal is converted into a digital value using an analog-to-digital converter. Noise is introduced when capturing photons to create digital images. Various types of noise introduced by the devices and processes to digitize images include readout noise, Johnson noise, photon noise and dark noise.

Noise affects a signal by, for example, adding and/or subtracting from the signal and/or introducing errors that cause incorrect results. By affecting the signal, noise causes the MCT FPA to produce a lower quality digital image.

SUMMARY

In general, one aspect of the subject matter described in this specification is embodied in a detector assembly that includes a first semiconductor layer of a first type configured to receive a photon. The detector assembly includes a second semiconductor layer of a second type. The second semiconductor layer is formed above the first semiconductor layer. The first semiconductor layer and the second semiconductor layer are configured to collect a signal. The detector assembly includes an interface layer that has an insulator portion for filtering noise and that is formed on the second semiconductor layer. The detector assembly includes a metal contact layer formed on the interface layer. The interface layer is configured to capacitively couple the first semiconductor layer and second semiconductor layer with the metal contact layer.

These and other embodiments may optionally include one or more of the following features. The insulator portion of the detector assembly may be configured to filter noise by restricting current flowing through the insulator portion. The insulator portion may form the entire interface layer that covers the second semiconductor layer. The insulator portion may have a thickness that prevents direct current from flowing through the interface layer. The detector assembly may include an intermediate metal layer that is formed between the second semiconductor layer and the interface layer. The intermediate metal layer, the first semiconductor layer and the second semiconductor layer may be capacitively coupled to the metal contact layer. The interface layer of the detector assembly may have a metal contact portion that partially covers the second semiconductor layer, and an insulator portion that covers a remainder of the second semiconductor layer.

The metal contact portion may be capacitively coupled to the second semiconductor layer and may be configured to drain accumulated free charge. The insulator portion may prevent flow of direct current to the metal contact layer from the second semiconductor layer. The detector assembly may include a wide bandgap layer formed between the second semiconductor layer and the insulator layer. The wide bandgap layer may be configured to reduce dark current and may improve control of semiconductor depletion. The interface layer may have a wide bandgap portion that may partially cover the second semiconductor layer.

In another aspect, the subject matter is embodied in a method for manufacturing the detector assembly. The method may include forming a first semiconductor layer of a first type configured to receive a photon. The method may include forming a second semiconductor layer of a second type above the first semiconductor layer of the first type, the first semiconductor layer and the second semiconductor layer may be configured to collect a signal. The method may include forming an interface layer above the second semiconductor layer. The interface layer may have an insulator portion that may be configured to filter noise. The method may include depositing a metal contact layer above the interface layer. The signal collected from the first semiconductor layer and the second semiconductor layer may be transferred by capacitive coupling to the metal contact layer.

In another aspect, the subject matter is embodied in a detector assembly. The detector assembly may include a first semiconductor layer of a first type may be configured to receive a photon. The detector assembly may include a second semiconductor layer of a second type formed above the first semiconductor layer of the first type, the first semiconductor layer and the second semiconductor layer may be configured to collect a signal. The detector assembly may include an insulator layer that covers the second semiconductor layer and may be configured to reduce contact noise. The detector assembly may include a metal contact layer formed on the insulator layer. The signal collected from the first semiconductor layer and the second semiconductor layer may be transferred by capacitive coupling to the metal contact layer.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, detectors and methods for minimizing and reducing noise within a device. Particular embodiments of the subject matter described in this specification may be implemented to realize one or more of the following advantages.

A detector assembly, such as an infrared sensor, that reduces or eliminates noise when collecting photocharges to produce a digital signal, e.g., a digital image. Noise is a fundamental, although undesirable, attribute of capturing photons to create digital images and may cause errors within the digital images. Noise sources include dark noise, photon noise and Johnson noise. Johnson noise is electronic noise generated due to the thermal agitation of charge carriers in a resistor of a device. In particular, the Johnson noise is generated by a contact resistance in the detector assembly between the metal terminal and semiconductor of the detector assembly.

Metal contacts in HgCdTe (MCT) FPAs in shorter wavelength cutoff infrared (IR) detectors are difficult to make in low resistance. The higher contact resistance value, e.g., resistance value above approximately $10^6$ ohms, generates Johnson noise. The Johnson noise coming from the contact resistance contributes to the read noise of the pixel which degrades the image.

Typically, the interface between the metal contact and the semiconductor is optimized to reduce the resistance to minimize the noise. For example, the area of the metal contact may be increased to diffuse the total resistance across a greater area in which a current may flow. Additionally, the amount of doping may be increased across the surface of the interface to reduce noise. However, for a surface of a semiconductor the amount of doping that may be activated may be limited.

Johnson noise is reduced or eliminated within the detector assembly. For example, the correlated double sampling (CDS) noise is reduced from approximately 15-20 electrons (e−) to less than 10 e− for FPA in short wavelength infrared (SWIR) and near infrared (NIR) sensors. By reducing or eliminating the overall noise, the signal produced by the FPA contains less errors and the detector assembly produces an image that is more clear and of higher quality.

Other benefits and advantages include filtering the noise while maintaining high signal gain. Additionally, surface dark current and/or other noise is reduced and surface accumulation or inversion is prevented which improves the quality of the generated images from the detector assembly.

Figure 1A:
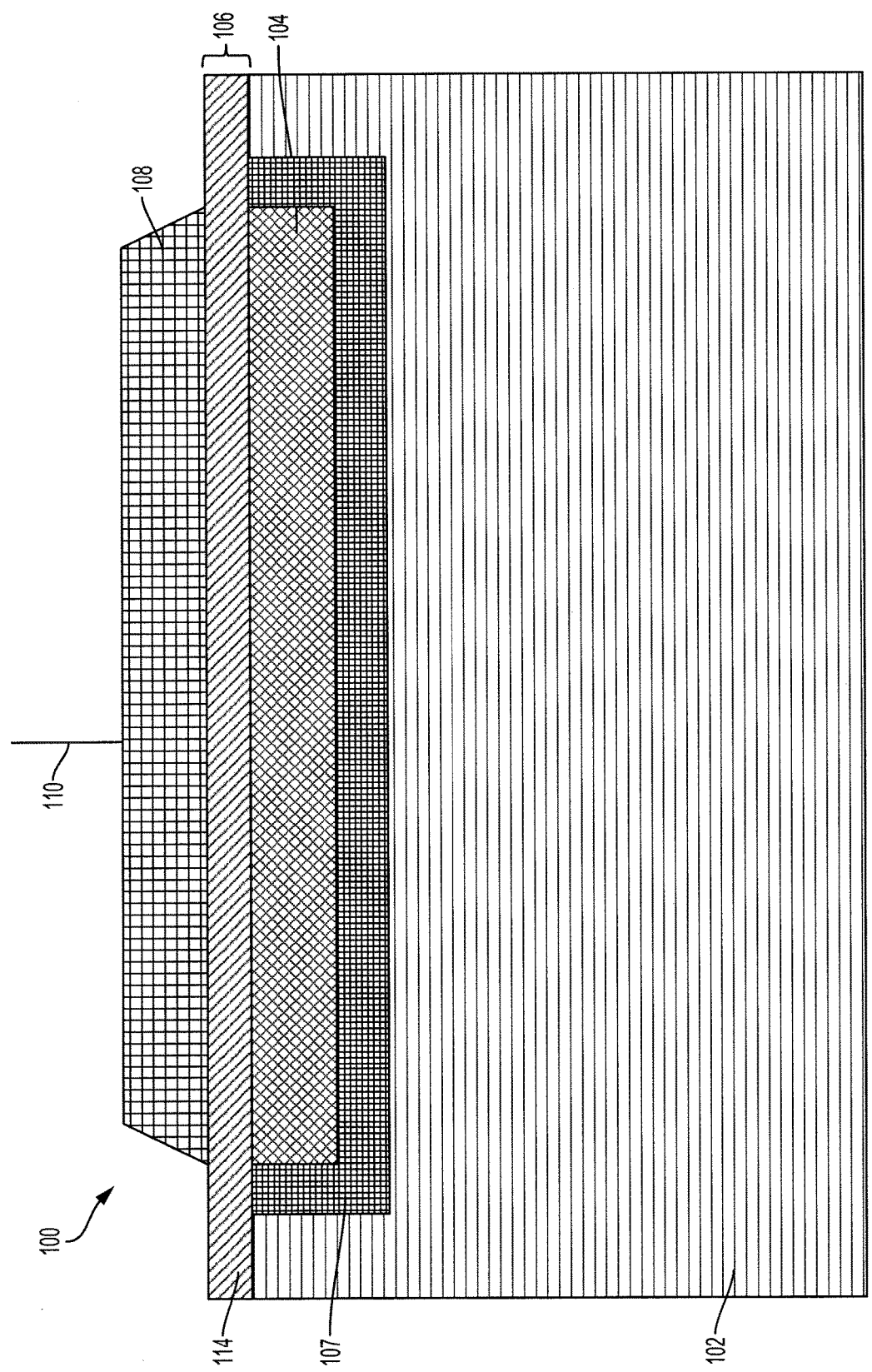
FIG. 1A is a cross-sectional view of a detector assembly having a Metal-Insulator PN (MIPN) diode configuration according to an aspect of the invention.

FIG. 1A is a cross-sectional view illustrating a detector assembly 100 having a Metal-Insulator PN (MIPN) diode configuration. The detector assembly 100 has a stacking structure that includes one or more semiconductor layers 102, 104, one or more interface layers 106 having a dielectric portion 114, one or more metal contact layers 108 and a collecting terminal 110.

The one or more semiconductor layers 102, 104 are capacitively coupled to the one or more metal contact layers 108 and the collecting terminal 110 through the interface layer 106. The one or more semiconductor layers 102, 104 may be formed from one or more substrates, such as Silicon (Si) or indium antimonide (InSb), or from epitaxy of semiconductor material on a suitable underlying substrate. There is no specific limitation of materials for forming the one or more substrates of the one or more semiconductor layers 102, 104.

The one or more semiconductor layers 102, 104 may have a first semiconductor layer 102 and a second semiconductor layer 104. The first semiconductor layer 102 and the second semiconductor layer 104 may be electrically connected. The first semiconductor layer 102 may be an n-type semiconductor, and the second semiconductor layer 104 may be a p-type semiconductor. The two semiconductor layers 102, 104 may form a p-n junction that allows the flow of electricity in one direction but not in the other direction. That is, there is low resistance in the forward bias direction and infinite resistance in the reverse bias direction due to depleted charge carriers at the interface between the two semiconductor layers 102, 104. A region of the first semiconductor layer 102 may have a wider bandgap that assists in surface passivation. The interface or junction between the p-type semiconductor and the n-type semiconductor may have a depletion region 107 where the charge carriers have been diffused away and generates an electrical field that causes defects, such as the trapping of charge and/or additional dark current. Within the depletion region 107, charge is prevented from flowing through and the voltage is dropped.

Figure 1B:
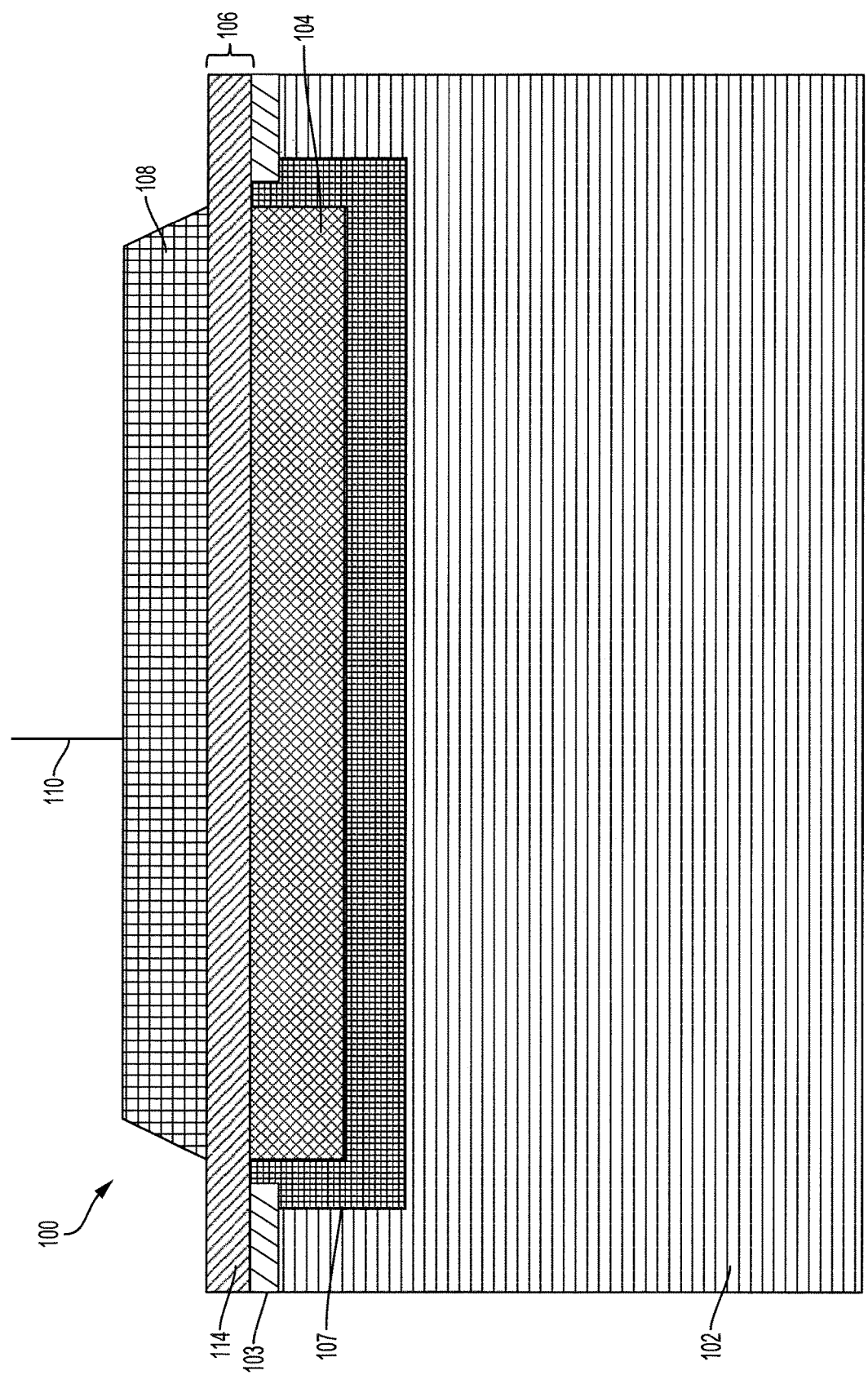
FIG. 1B is a cross-sectional view of a detector assembly having a MIPN diode configuration with an n+ portion according to an aspect of the invention.

The area where the depletion region 107 meets the interface surface in the detector assembly 100 is less than the area of the depletion region in an Metal-Insulator-Semiconductor (MIS) or Metal-Insulator N-type (MIN) device. In an MIS or MIN diode configuration the contact area of the depletion region with the metal contact layer is across the entire surface beneath the metal contact layer. By reducing the interface area of the depletion region 107, the detector assembly 100 reduces the trapping of charge, dark current, persistence and/or other secondary surface defects on the signal arising from that interface. An additional n+ portion 103 may be added to further reduce the surface area of the depletion region 107, as shown in FIG. 1B, for example.

The first semiconductor layer 102 may collect photons or light. For example, the first semiconductor layer 102 may have a sensor that detects and/or collects light emitted, reflected and/or refracted from an object, such as a star, planet or other celestial body. The first semiconductor layer 102 may absorb the photons or light and form electron hole pairs. The first semiconductor layer 102 may be electrically connected to and adjacent to the second semiconductor layer 104. A readout integrated circuit (ROIC) may convert the photocharge into a signal.

The second semiconductor layer 104 may be formed on or above the first semiconductor layer 102. The first semiconductor layer 102 and the second semiconductor layer 104 may collect the signal and provide the signal to one or more metal contact layers 108 and the collecting terminal 110. The collected electron charge may diffuse into the second semiconductor layer 104 from the first semiconductor layer 102. After the electron charge crosses into the second semiconductor layer 104, the electron charges in the second semiconductor layer 104 are minority carriers which are collected in the second semiconductor layer 104.

The detector assembly 100 includes one or more interface layers 106. The interface layer 106 includes a portion made of a dielectric material, such as the dielectric portion 114. The dielectric portion 114 is an insulator that prevents the direct flow of electrical charges through the material. The dielectric portion 114 may be made of zinc sulfide (ZnS), silicon nitride (SiN), silicon dioxide ($SiO_2$), cadmium telluride (CdTe) or any other insulator, for example. The interface layer 106 is deposited above the one or more semiconductor layers 102, 104 and in between the one or more semiconductor layers 102, 104 and the metal contact layer 108.

The dielectric portion 114 of the interface layer 106 filters noise from the signal that passes from the one or more semiconductor layers 102, 104 to the metal contact layer 108 and collecting terminal 110. The dielectric portion 114 creates an infinite resistance between the one or more semiconductor layers 102, 104 and the metal contact layer 108. By creating an infinite resistance between the two layers, the dielectric portion 114 forms a capacitive coupling or alternative current (AC) coupling between the one or more semiconductor layers 102, 104 and the metal contact layer 108 and collecting terminal 110. The dielectric portion 114 blocks direct current flow between the one or more semiconductor layers 102, 104 and the metal contact layer 108 but allows a transient signal, such as an AC signal, to pass through to the collecting terminal 110. By using an AC-coupled connection to the collecting terminal 110, the detector assembly 100 avoids creating Johnson noise within the detector assembly 100.

Figure 2:
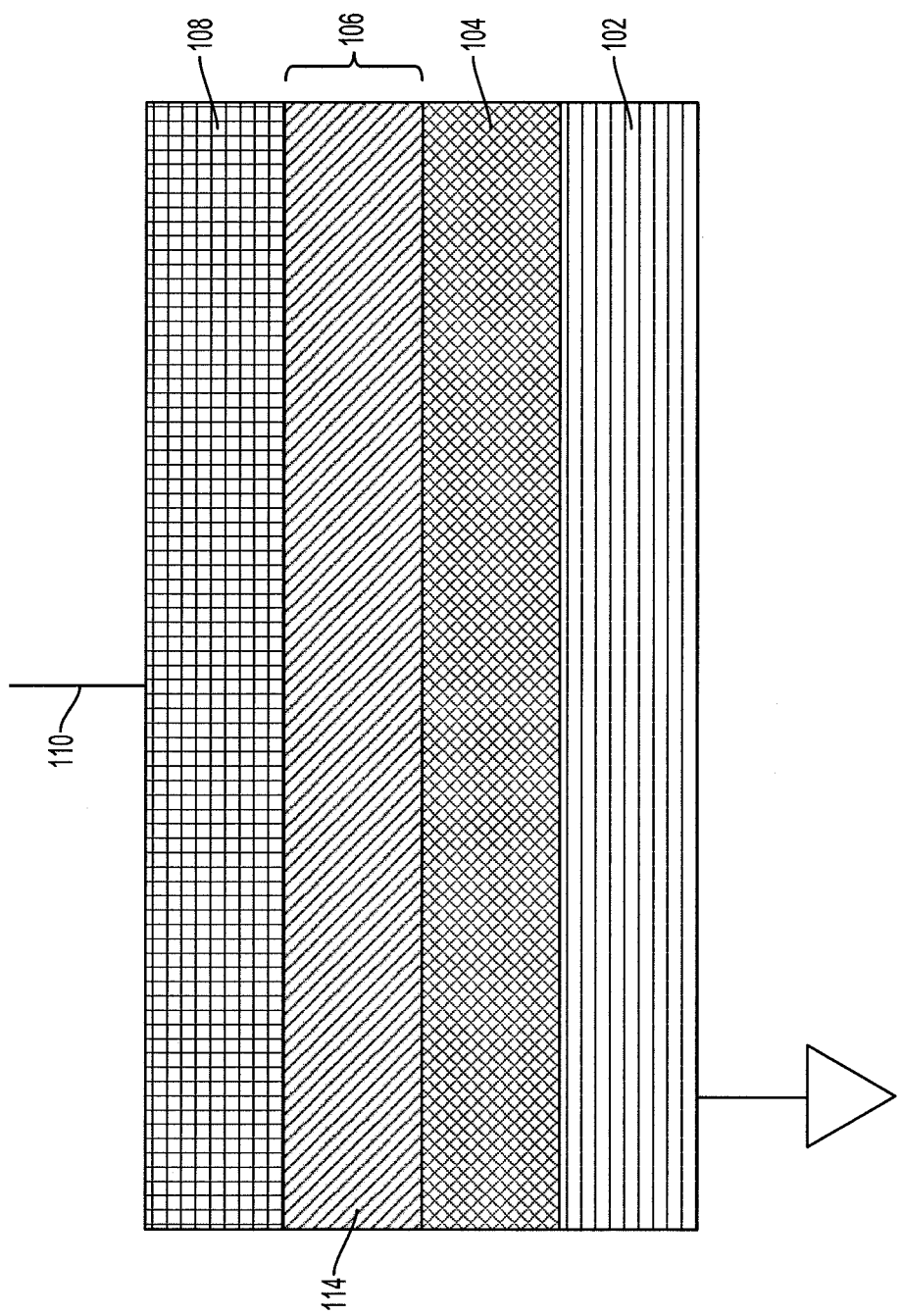
FIG. 2 is a perspective view of the different layers of the detector assembly of FIG. 1 according to an aspect of the invention.

The interface layer 106 may be formed entirely of the dielectric material, such as dielectric portion 114 in the MIPN diode configuration of FIGS. 1A-B and FIG. 2. The MIPN junction eliminates the Johnson noise and AC couples the one or more semiconductor layers 102, 104 with the metal contact layer 108 through the interface layer 106.

Figure 10:
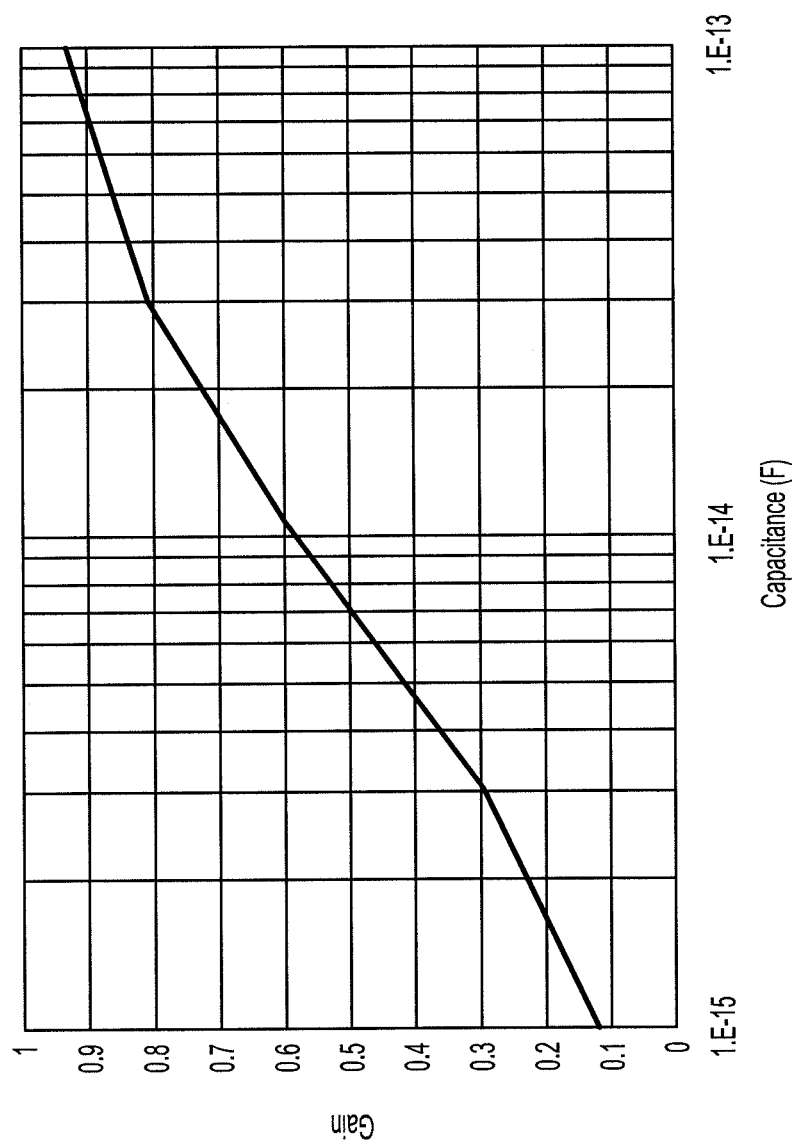
FIG. 10 is an example diagram showing the effects of the thickness of the dielectric portion of the MIPN configuration on the signal gain according to an aspect of the invention.

The dielectric portion 114 has a particular thickness and amount that affects the amount of Johnson noise that is eliminated or filtered. The particular thickness and amount of the dielectric portion 114 directly correlates with the amount of Johnson noise that is eliminated or filtered. The thickness of the dielectric portion 114 may range from 50 to 30,000 Angstroms (A) when the dielectric portion 114 is made from silicon nitride which results in a comparable capacitance for the dielectric portion 114 ranging from 1.00E-13 farads (F) to 1.00E-15 F, for example. An optimum thickness to maximize the signal gain in the detector assembly 100 may be 50-100 A, for example, and may depend on the ratio of the capacitance of the dielectric portion 114 (or dielectric capacitance) to that of the capacitance of the semiconductor depletion region 107 (or depletion region capacitance). The effect of the thickness of the dielectric portion 114 of the MIPN on the signal gain is shown FIG. 10.

The detector assembly 100 having the MIPN diode configuration with the dielectric portion 114 covering the entire second semiconductor layer 104 reduces or eliminates the amount of noise gain to less than 0.05 e− or approximately 0 e− while maintaining a signal gain of approximately 0.65 for dielectric capacitance of at least 1E-14 F.

Figure 3:
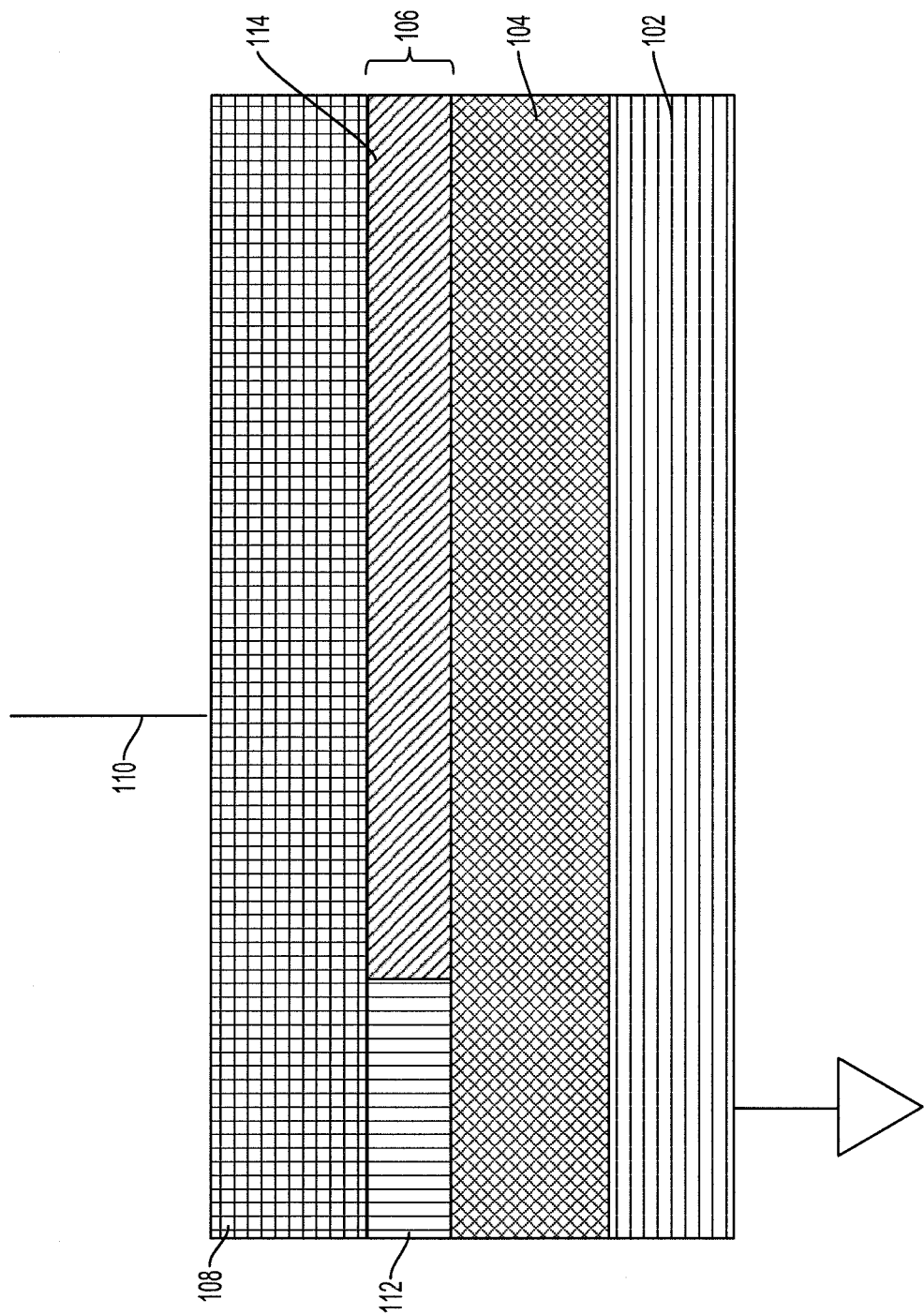
FIG. 3 is a perspective view of a detector assembly having a hybrid metal-insulator interface layer according to an aspect of the invention.

In some implementations, the interface layer 106 includes the dielectric portion 114 and a metal contact portion 112 within the interface layer 106, as shown in FIG. 3. The ratio of the metal contact portion 112 and dielectric portion 114 may vary. For example, interface layer 106 may be one-fourth metal contact portion 112 and three-fourths dielectric portion 114 or one-half metal contact portion 112 and one-half dielectric portion 114. The metal contact portion 112 and the dielectric portion 114 may be arranged in any number of arrangements to cover the one or more semiconductor layers 102, 104. The ratio of the dielectric portion 114 to the metal contact portion 112 that covers the second semiconductor layer 104 may vary which causes the amount of noise eliminated or reduced and the amount of signal gain to vary. As the ratio or amount of the dielectric portion 114 in comparison to the metal contact portion 112 in the interface layer 106 increases, the amount of direct current that flows between the second semiconductor layer 104 and the metal contact layer 108 decreases. The amount of noise gain caused by the contact resistance of the detector assembly also decreases. As the ratio or the amount of the dielectric portion 114 decreases, the amount of direct current that flows directly through increases which increases the amount of noise gain caused by the contact resistance.

The metal contact portion 112 within the interface layer 106 allows the one or more metal contact layers 108 to be electrically connected to the second semiconductor layer 104 through the metal contact portion 112. The metal contact portion 112 drains accumulated free charge, while a portion of the signal is capacitively coupled through the dielectric portion 114. The amount of the signal that is capacitively coupled through the dielectric portion 114 is based on the ratio between the dielectric portion 114, the metal contact portion 112, and the capacitance of the semiconductor depletion region 107. The noise gain is dependent on the ratio of the dielectric portion 114 capacitance to the depletion region 107 capacitance, with the dielectric portion 114 capacitance acting as a filter to the noise generated by the metal-semiconductor region. The amount of signal that is capacitively coupled may correlate with a reduction in noise gain.

Figure 4:
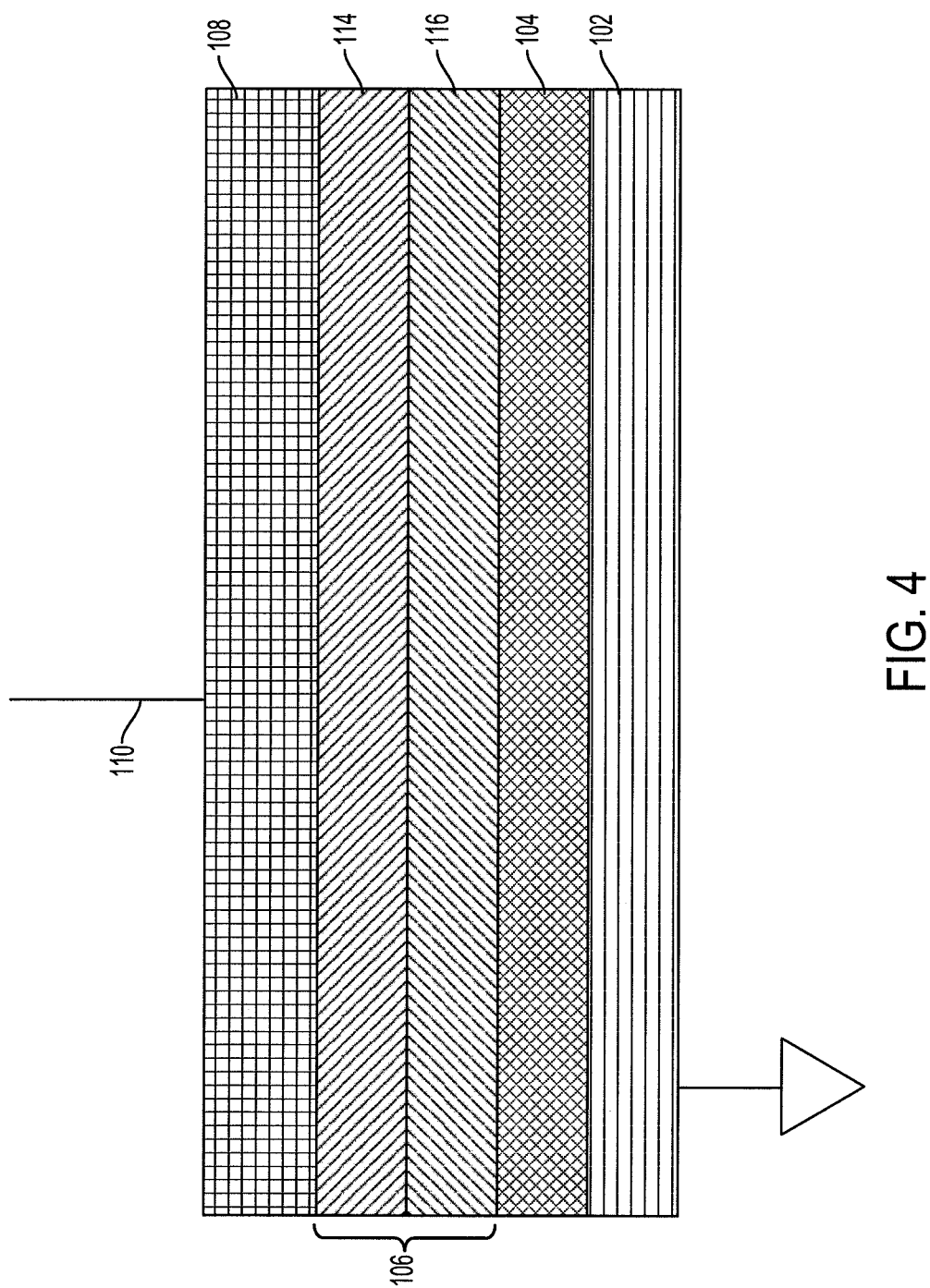
FIG. 4 is a perspective view of a detector assembly having a wide bandgap layer according to an aspect of the invention.
Figure 5:
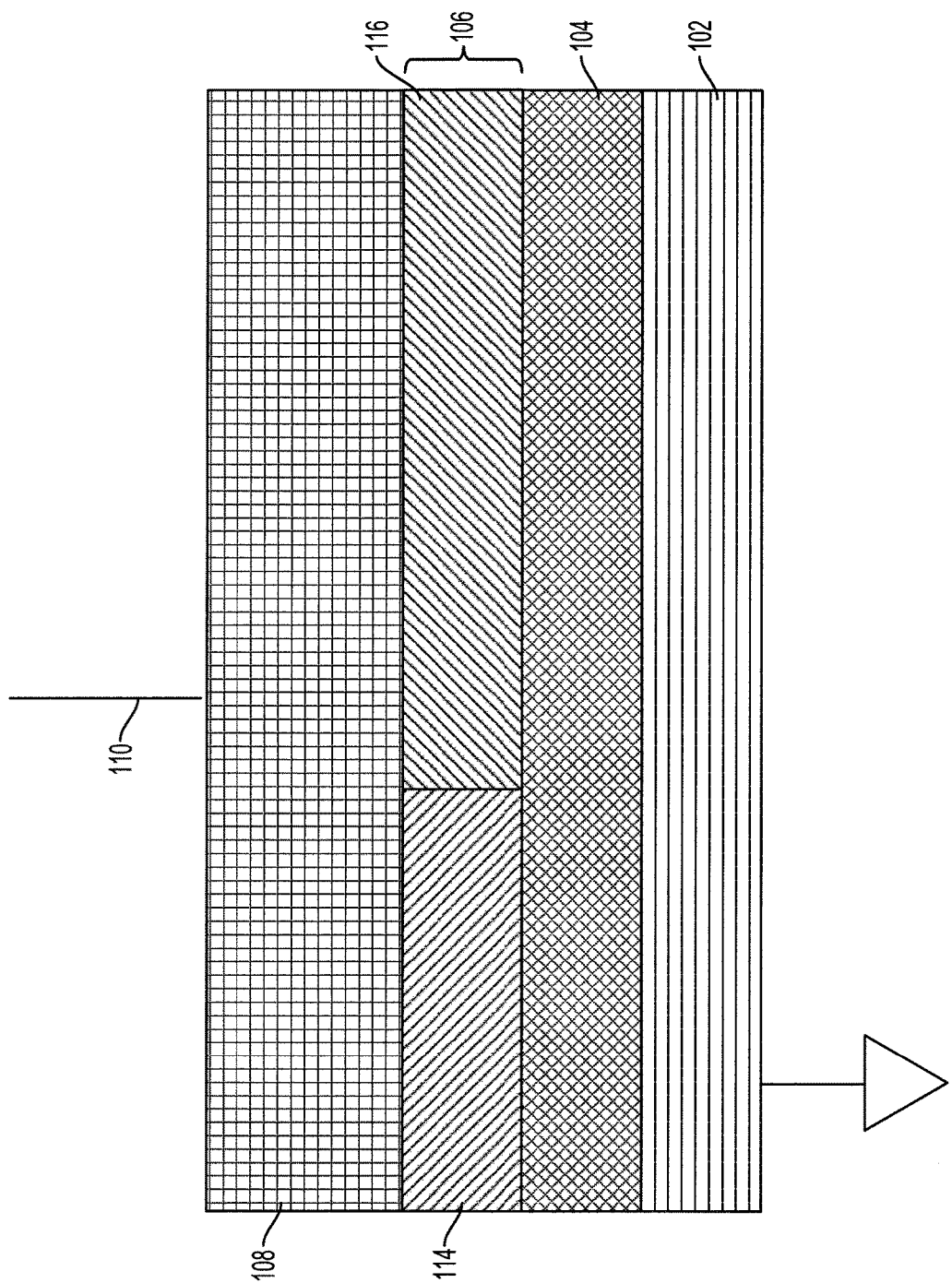
FIG. 5 is a perspective view of a detector assembly having a hybrid wide bandgap-insulator interface layer according to an aspect of the invention.

In some implementations, the interface layer 106 includes the dielectric portion 114 and a wide bandgap portion 116, as shown in FIGS. 4-5. The wide bandgap portion 116 may partially cover the second semiconductor layer 104, as shown in FIG. 5, or completely cover the second semiconductor layer 104, as shown in FIG. 4.

When the wide bandgap portion 116 of the interface layer 106 covers the entire second semiconductor layer 104, the wide bandgap portion 116 is deposited on the second semiconductor layer 104 and the dielectric portion 114 is deposited on the wide bandgap portion 116 so that the wide bandgap portion 116 is between the second semiconductor layer 104 and the dielectric portion 114. The wide bandgap portion 116 reduces surface dark current and is more easily surface passivated. The wide bandgap portion 116 may have a lower surface dark current. The wide bandgap portion 116 may permit the detector assembly 100 to operate at much higher voltages, frequencies and/or temperatures than otherwise.

When the wide bandgap portion 116 covers a portion of the second semiconductor layer 104 and the dielectric portion 114 covers the remaining portion of the second semiconductor layer 104, the ratio of the two portions effect the characteristics of the interface layer 106. The amount of direct current that is prevented from flowing between the second semiconductor layer 104 and the metal contact layer 108 and the amount of reduction in surface dark current may be based on the ratio of the amount of the dielectric portion 114 and the wide bandgap portion 116.

The detector assembly 100 includes one or more metal contact layers 108. The one or more metal contact layers 108 are capacitively coupled to the one or more semiconductor layers 102, 104.

The collecting terminal 110 is directly connected to the one or more metal contact layers 108 and connected to the one or more semiconductor layers 102, 104 through the one or more interface layers 106. The collecting terminal 10 may provide the signal to an output device.

Figure 6:
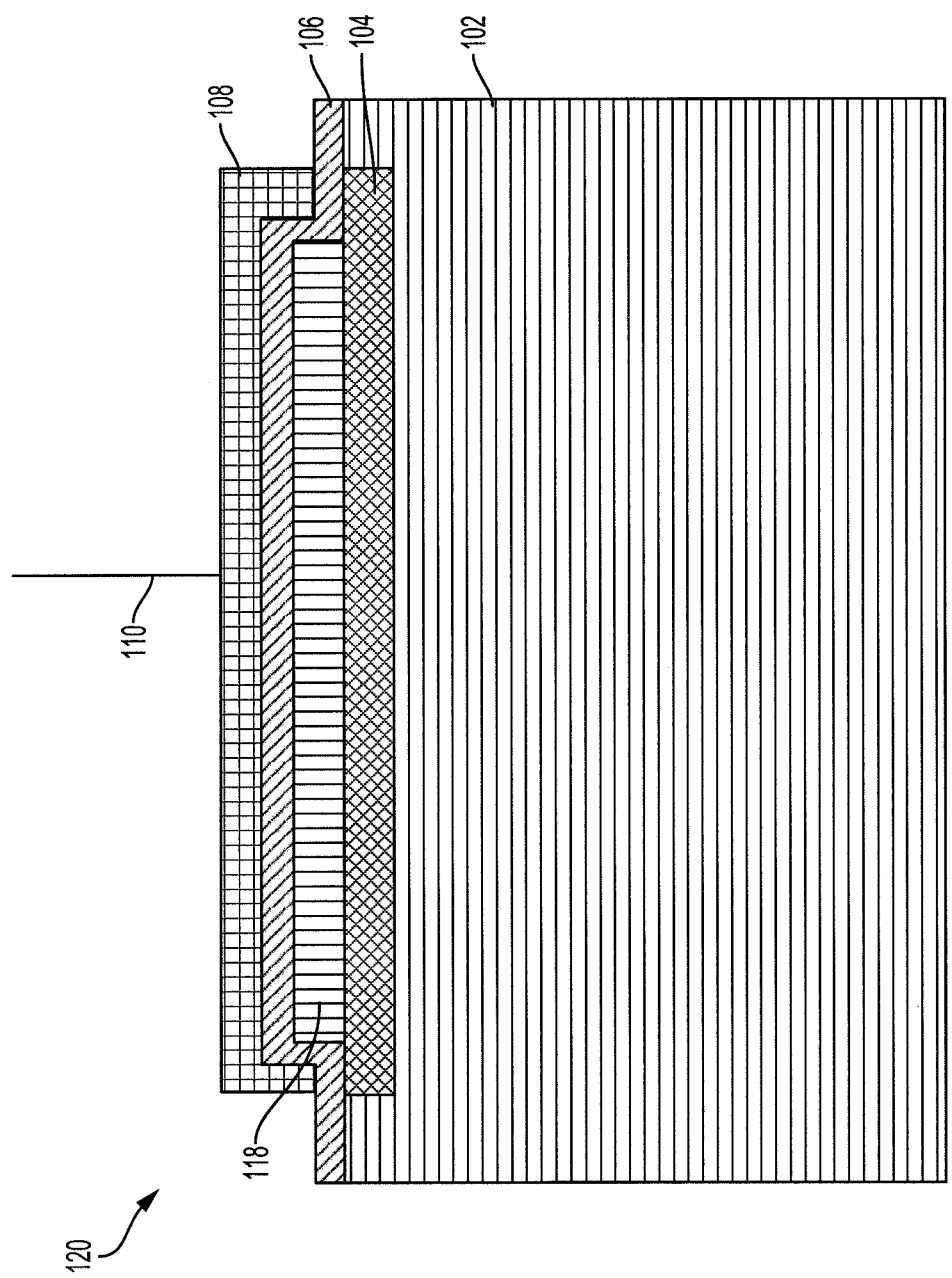
FIG. 6 is a cross-sectional view of a detector assembly having a Metal-Insulator-Metal PN (MIMPN) diode configuration according to an aspect of the invention.
Figure 7:
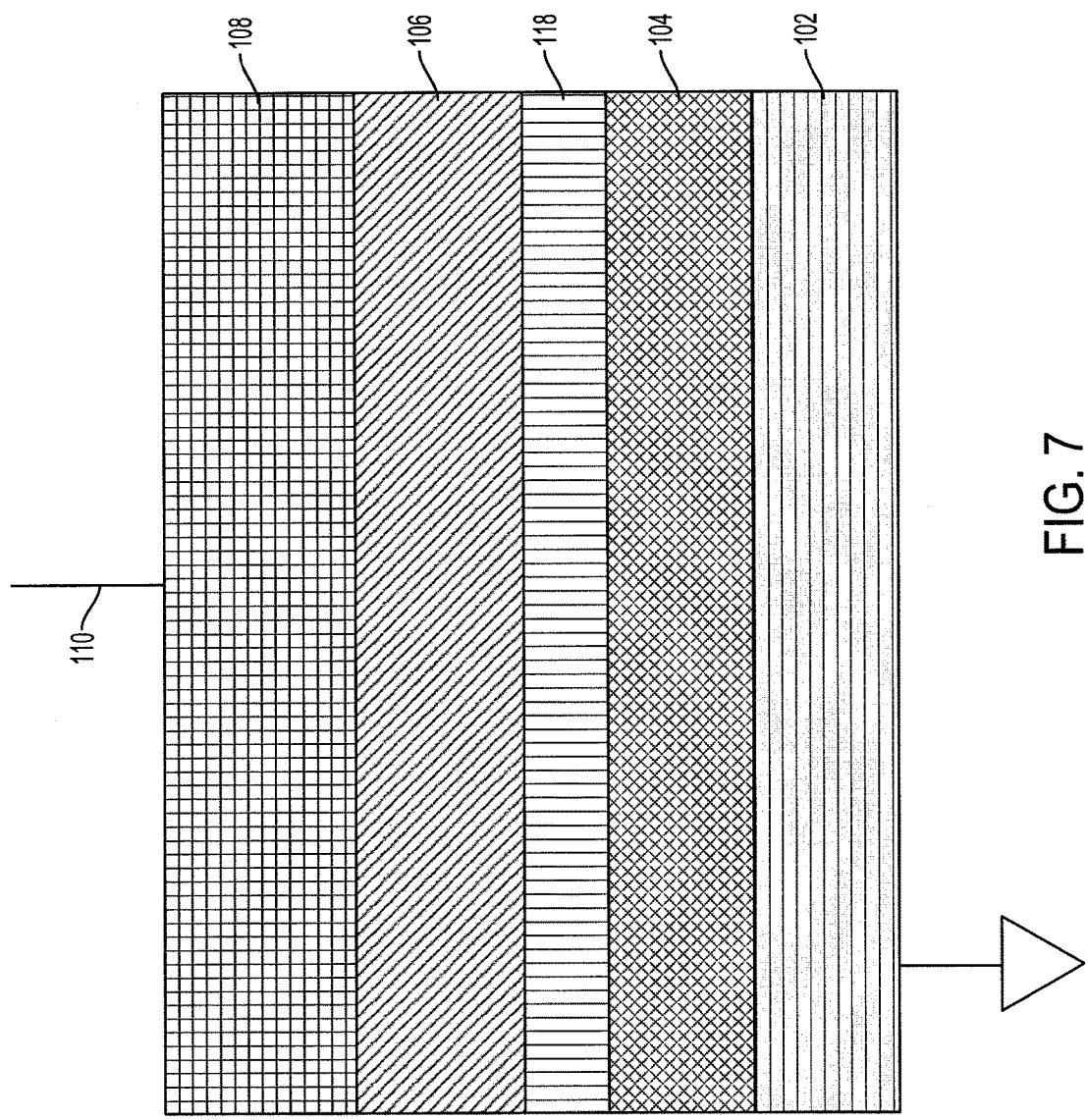
FIG. 7 is a perspective view of a detector assembly having an intermediate metal layer according to an aspect of the invention.

FIG. 6 is a cross-sectional view illustrating a detector assembly 120 having a Metal-Insulator-Metal PN (MIMPN) diode configuration. The detector assembly 120 has a stacking structure that includes one or more semiconductor layers 102, 104, one or more interface layers 106, one or more metal contact layers 108 an intermediate metal layer 118 and a collecting terminal 110, as shown in FIG. 7, for example.

Similarly numbered components between the detector assembly 120 having the MIMPN diode configuration and the detector assembly 100 having the MIPN diode configuration may have the same characteristics and perform the same functions. The one or more metal contact layers 108, the metal contact portion 112 and/or the intermediate metal layer 118 may be made of the same or different metal. The type of metal of the one or more metal contact layers, the metal contact portion 112 or the intermediate metal layer 118 does not affect the reduction or elimination of the noise resulting from the AC coupling of the second semiconductor layer 104 to the one or more metal contact layers 108 through the dielectric portion 114. That is, the filtering of the noise does not depend on the type of metal in the detector assembly but rather the dielectric material in the interface layer 106.

The detector assembly 120 has an intermediate metal layer 118. The intermediate metal layer 118 is positioned in between the interface layer 106 and the second semiconductor layer 104. The intermediate metal layer 118 entirely covers the second semiconductor layer 104. The intermediate metal layer 118 and the one or more semiconductor layers 102, 104 are capacitively (AC) coupled through the interface layer 106 that is composed entirely of the dielectric portion 114 to the metal contact layer 108.

The detector assembly 120 having the MIMPN diode configuration with the dielectric portion 114 covering the entire intermediate metal layer 118 may reduce or eliminate the amount of noise gain to less than 0.5 or approximately 2 e− while maintaining a signal gain of between 0.65 and 0.9.

Figure 8:
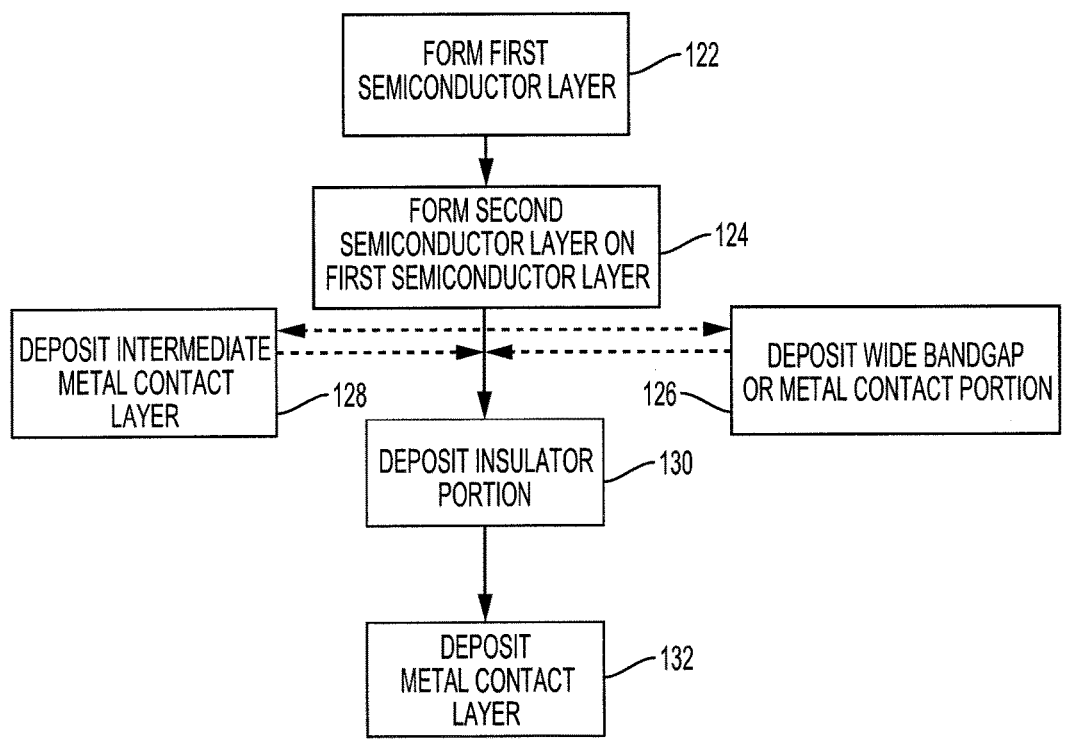
FIG. 8 is an example process for fabrication of a detector assembly according to an aspect of the invention.

FIG. 8 is a flow diagram of an example process for fabricating the detector assembly 100 or 120. A fabrication system that uses plasma deposition, chemical vapor deposition or electron-beam deposition fabricates the detector assemblies 100, 120. The fabrication system forms a first semiconductor layer 102 (122). The fabrication system forms the second semiconductor layer 104 on top of and adjacent to the first semiconductor layer 102 (124). The second semiconductor layer 104 covers the entire first semiconductor layer 102.

The one or more semiconductor layers 102, 104 may be formed from one or more substrates, such as Silicon (Si) or Silicon Carbide (SiC). There is no specific limitation of materials for forming the one or more substrates of the one or more semiconductor layers. The formation of the one or more semiconductor layers 102, 104 is described in FIG. 9.

The fabrication system forms one or more interface layers 106 on top of and adjacent to the second semiconductor layer 104. The one or more interface layers 106 include forming a dielectric portion 114 (130) and may include forming at least one of a wide bandgap portion 116 or a metal contact portion 112 (126). The fabrication system may deposit the dielectric portion 114 on the second semiconductor layer to partially cover or entirely cover the second semiconductor layer 104.

When the dielectric portion 114 partially covers the second semiconductor layer 104, the fabrication system deposits at least one of a wide bandgap portion 116 or a metal contact portion 112 adjacent to the dielectric portion 114 within the same layer to cover the remaining portion of the second semiconductor layer 104. The fabrication system may arrange the one or more portions in an alternating pattern. The amount that the one or more portions cover the second semiconductor layer 104 may vary resulting in varying amounts of direct current flowing between the metal contact layer 108 and the second semiconductor layer 104.

In some implementations, the wide bandgap portion 116 completely covers the second semiconductor layer 104. If the wide bandgap portion 116 completely covers the second semiconductor layer 104, the fabrication system may form the wide bandgap portion 116 in between the second semiconductor layer 104 and the dielectric portion 114.

In some implementations, the fabrication system deposits the dielectric portion 114 on top of the wide bandgap portion 116 if the wide bandgap portion 116 covers the entire second semiconductor layer 104. In some implementations, the fabrication system deposits an intermediate metal layer 118 that covers the entire second semiconductor layer 104 in which case the dielectric portion 114 of the interface layer 106 is deposited on the intermediate metal layer 118 (128).

The fabrication system deposits one or more metal contact layers 108 on top of and adjacent to the one or more interface layers 106 (132). The one or more metal contact layers 108 are connected to a collecting terminal 110 and are AC coupled to the one or more semiconductor layers 102, 104 through the interface layer 106.

Figure 9:
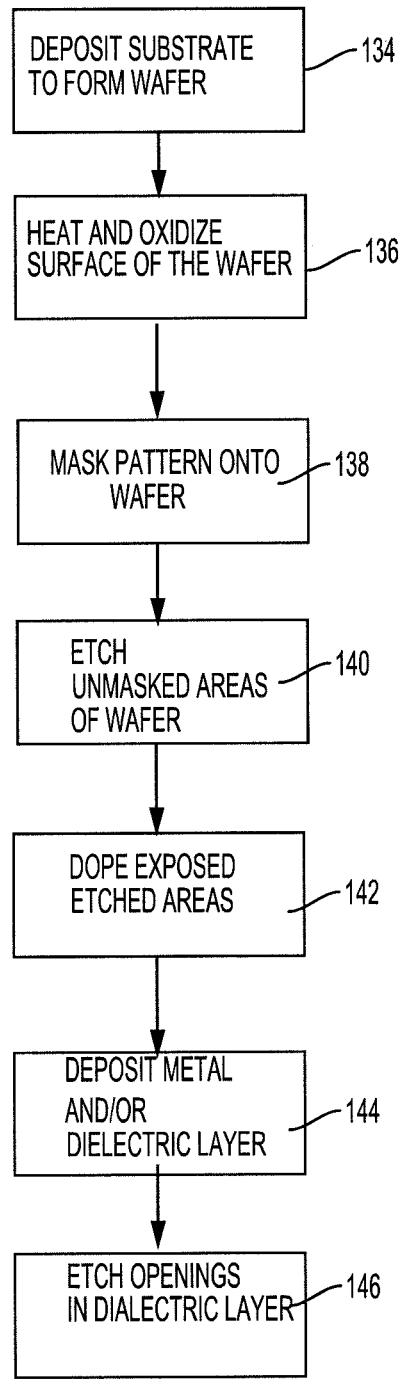
FIG. 9 is an example process for fabrication of a semiconductor layer according to an aspect of the invention.

FIG. 9 is an example process for fabrication of a semiconductor layer. A fabrication system may deposit one or more substrates to form a wafer (134). The wafer is then thermally oxidized, i.e., heated and exposed to oxygen, to form a thin film layer on the surface of the wafer (136). One or more portions of the surface of the wafer are masked in a particular pattern using a photoresist or light sensitive film that is applied to the wafer (138). The one or more portions of the surface of the wafer that are unmasked are etched away (140). The one or more portions that are exposed by the etched away portions are altered by doping to form the n-type or p-type electrical characteristics (142). The process is repeated to form either the front end layer of the p-type or n-type semiconductor. Metal and/or dielectric material is deposited to the front end layer to interconnect devices on the wafer (144). A dielectric layer may be deposited at the end of the process to protect the wafer. One or more openings are etched into the dielectric layer to allow access to the devices of the semiconductor layer (146).

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A detector assembly, comprising:
a first semiconductor layer of a first type having an exposed surface not attached to another layer and configured to collect a photon;
a second semiconductor layer of a second type formed directly on the first semiconductor layer of the first type, the first semiconductor layer and the second semiconductor layer configured to collect a signal;
an interface layer including an insulator portion for filtering noise from the signal, the interface layer being formed on the second semiconductor layer; and
a metal contact layer formed directly on a top surface of the interface layer, the interface layer configured to capacitively couple the first semiconductor layer and the second semiconductor layer with the metal contact layer.

2. The detector assembly of claim 1, wherein the insulator portion is configured to filter noise by forming a capacitive connection between the second semiconductor layer and the metal contact layer.

3. The detector assembly of claim 2, wherein the insulator portion forms the entire interface layer and covers the second semiconductor layer, the insulator portion having a thickness that prevents direct current from flowing through the interface layer.

4. The detector assembly of claim 1, further comprising an intermediate metal layer formed between the second semiconductor layer and the interface layer, the intermediate metal layer, the first semiconductor layer and the second semiconductor layer capacitively coupled to the metal contact layer.

5. The detector assembly of claim 1, wherein the interface layer has a metal contact portion that partially covers the second semiconductor layer and the insulator portion covers a remainder of the second semiconductor layer.

6. The detector assembly of claim 5, wherein the metal contact portion is configured to drain accumulated free charge, wherein the insulator portion prevents flow of direct current to the metal contact layer from the second semiconductor layer and filters noise generated by the metal contact portion.

7. The detector assembly of claim 1, further comprising a wide bandgap layer formed between the second semiconductor layer and the interface layer.

8. The detector assembly of claim 7, wherein the wide bandgap layer is configured to reduce dark current and improve control of semiconductor depletion at the interface layer.

9. The detector assembly of claim 1, wherein the interface layer has a wideband gap portion that partially covers the second semiconductor layer and the insulator portion covers a remainder of the second semiconductor layer.

10. A method of manufacturing a detector assembly, the method comprising:
forming a first semiconductor layer of a first type having an exposed surface not attached to another layer and configured to collect a photon;
forming a second semiconductor layer of a second type directly on the first semiconductor layer of the first type, the first semiconductor layer and the second semiconductor layer configured to collect a signal;
forming an interface layer above the second semiconductor layer, the interface layer having an insulator portion configured to filter noise from the signal; and
depositing a metal contact layer directly on a top surface of the interface layer, the signal collected from the first semiconductor layer and the second semiconductor layer being transferred by capacitive coupling to the metal contact layer.

11. The method of claim 10, wherein the insulator portion is configured to filter noise by restricting current flowing through the insulator layer.

12. The method of claim 10, further comprising depositing an intermediate metal layer between the second semiconductor layer and the interface layer and configured to receive the signal collected from the first semiconductor layer and the second semiconductor layer, wherein the intermediate metal layer, the first semiconductor layer and the second semiconductor layer are capacitively coupled to the metal contact layer.

13. The method of claim 10, wherein the insulator portion partially covers the second semiconductor layer, and a metal contact portion is coupled to the second semiconductor layer to drain accumulated free charge.

14. The method of claim 10, further comprising depositing a wide bandgap layer between the second semiconductor layer and the interface layer.

15. A detector assembly, comprising:
a first semiconductor layer of a first type having an exposed surface not attached to another layer and configured to collect a photon;
a second semiconductor layer of a second type formed directly on the first semiconductor layer of the first type, the first semiconductor layer and the second semiconductor layer configured to collect a signal;
an insulator layer that covers the second semiconductor layer and is configured to reduce contact noise from the signal; and
a metal contact layer formed directly on a top surface of the insulator layer, the signal collected from the first semiconductor layer and the second semiconductor layer being transferred by capacitive coupling to the metal contact layer.

16. The detector assembly of claim 15, wherein the insulator layer has a thickness that maximizes signal gain and eliminates Johnson noise.

17. The detector assembly of claim 15 further comprising an intermediate metal layer disposed between the second semiconductor layer and the insulator layer and capacitively coupled to the metal contact layer, the intermediate metal layer configured to receive the signal collected from the first semiconductor layer and the second semiconductor layer.

18. The detector assembly of claim 15, further comprising a wide bandgap layer formed between the second semiconductor layer and the insulator layer.

19. The detector assembly of claim 18, wherein the wide bandgap layer is configured to reduce dark current and prevent surface accumulation of electrical charges.

20. The detector assembly of claim 15, wherein the insulator layer reduces the correlated double sampling (CDS) noise to less than 10 e− for short wavelength infrared (SWIR) and near infrared (NIR).

* * * * *